United States Patent
Clements et al.

(10) Patent No.: US 6,558,560 B2
(45) Date of Patent: May 6, 2003

(54) METHOD FOR THE FABRICATION OF ELECTRICAL CONTACTS

(75) Inventors: Bradley E Clements, Ft Collins, CO (US); Joseph M White, Windsor, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/917,357

(22) Filed: Jul. 27, 2001

(65) Prior Publication Data

US 2003/0022503 A1 Jan. 30, 2003

(51) Int. Cl.[7] .............................. B44C 1/22; C23F 1/00
(52) U.S. Cl. ............................ 216/18; 216/13; 216/41; 438/754
(58) Field of Search ...................... 216/13, 18, 20, 216/41; 438/725, 742, 754

(56) References Cited

U.S. PATENT DOCUMENTS

| | | | |
|---|---|---|---|
| 2,695,351 A | * 11/1954 | Beck | 156/901 X |
| 5,195,237 A | 3/1993 | Cray et al. | |
| 5,450,290 A | 9/1995 | Boyko et al. | |
| 5,601,678 A | 2/1997 | Gerber et al. | |

FOREIGN PATENT DOCUMENTS

JP    11163489    6/1999

* cited by examiner

*Primary Examiner*—William A. Powell
(74) *Attorney, Agent, or Firm*—Leslie P. Gehman

(57) ABSTRACT

A method for the fabrication of electrical contacts using metal forming, masking, etching, and soldering techniques is presented. The method produces a plurality of specialized electrical contacts, capable of use in an interposer, or other device, including non-permanent or permanent electrical connections providing contact wipe, soft spring rates, durability, and significant amounts of travel.

13 Claims, 13 Drawing Sheets

METHOD FOR THE FABRICATION OF ELECTRICAL CONTACTS

FIELD OF THE INVENTION

This invention relates generally to the field of electrical contacts and more specifically to methods for the fabrication of electrical contacts.

BACKGROUND OF THE INVENTION

Existing electrical contact designs include interposers constructed from elastomeric material and interposers constructed from balls of wire. Both of these solutions have limitations inherent in their design. Current elastomeric materials are unable to sustain adequate contact spring force over time and temperature and have a small range of working heights. Interposers constructed from balls of wire are fragile, prone to unravel, often require costly inspection, and provide a limited amount of contact travel.

SUMMARY OF THE INVENTION

A method for the fabrication of electrical contacts using metal forming, masking, etching, and soldering techniques is presented. The method produces a plurality of specialized electrical contacts, capable of use in an interposer, or other device, including non-permanent or permanent electrical connections providing contact wipe, soft spring rates, durability, and significant amounts of travel.

Other aspects and advantages of the present invention will become apparent from the following detailed description, taken in conjunction with the accompanying drawings, illustrating by way of example the principles of the invention.

DETAILED DESCRIPTION

Figure 1:
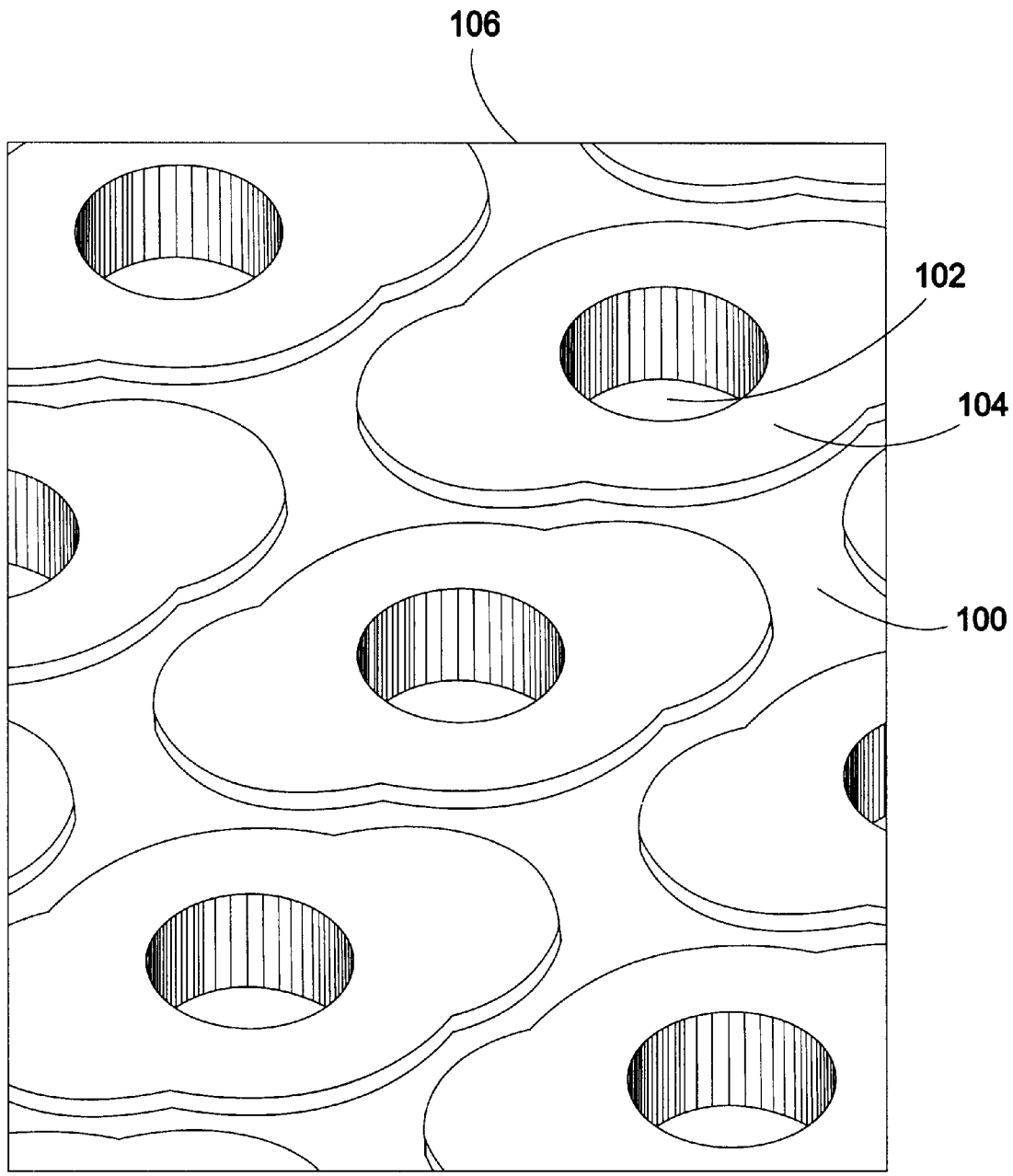
FIG. 1 is a perspective view of an embodiment of a printed circuit board comprising a quantity of through-plated vias according to the present invention.

FIG. 1 is a perspective view of an embodiment of a printed circuit board (PCB) comprising a quantity of through-plated vias 106, according to the present invention. In an example embodiment of the present invention a printed circuit board substrate 100 is plated with copper on both sides of the substrate and the copper is etched leaving areas of copper 104, surrounding each of the holes 102, on opposite sides of the substrate from each other. While the areas of copper 104 in this embodiment are somewhat elliptical in shape, other shapes of the areas of copper 104 will work equally well within the scope of the present invention. For example, in some embodiments of the present invention, the area of copper 104 may be circular, square, rectangular, or other, more complex, shapes.

While copper is a preferred metal, other example embodiments of the present invention may use other materials for the plating. The substrate 100 may comprise a wide variety of materials, with fiberglass as a common choice of material. Holes 102 are then drilled through the center of each area of copper 104. The barrel of the holes are then through-plated to connect the corresponding areas of copper 104 on opposite sides of the substrate 100 thereby forming an array of through-plated vias 106. This drilled and plated PCB may be created by any standard PCB manufacturing system, and will be as the substrate for a plurality of specialized electrical contacts referred herein to as micro-spider contacts. A PCB with these micro-spider contacts may be used as an interposer in an electronic system.

Figure 2:
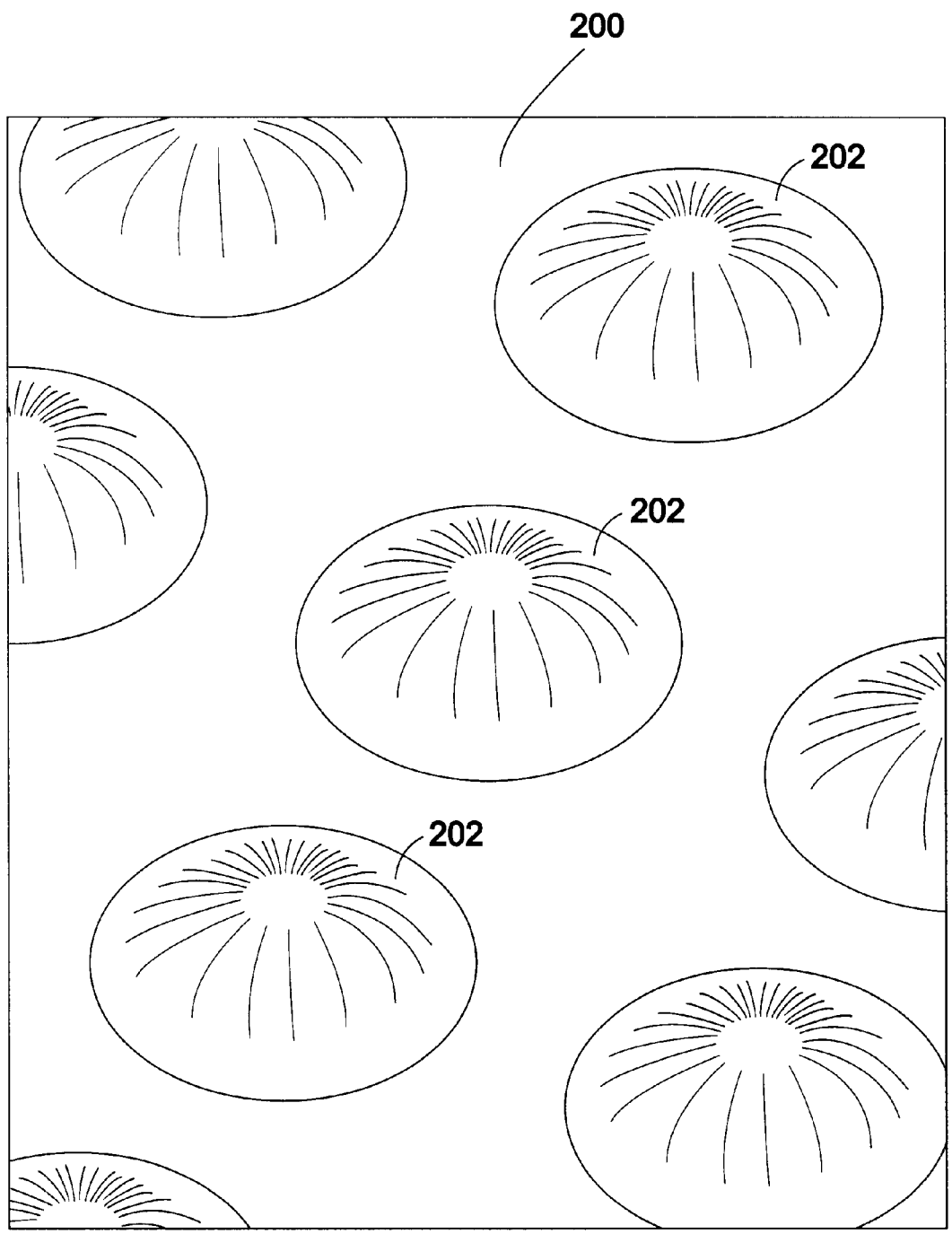
FIG. 2 is a perspective view of an embodiment of a metal sheet comprising a quantity of domes according to the present invention.

FIG. 2 is a perspective view of an embodiment of a metal sheet comprising a quantity of domes according to the present invention. A metal sheet 200 is processed such that it comprises a plurality of small domes 202. The metal sheet 200 may be copper or other conductive metals as needed for any particular implementation of the present invention. The size of the domes 202 may also be varied as needed for any particular implementation of the present invention. In an example embodiment of the present invention, the domes 202 in the metal sheet 200 have a one-to-one correspondence with the through-plated holes 102 on the PCB substrate 100, however other embodiments of the present invention need not maintain this one-to-one correspondence.

Figure 3:
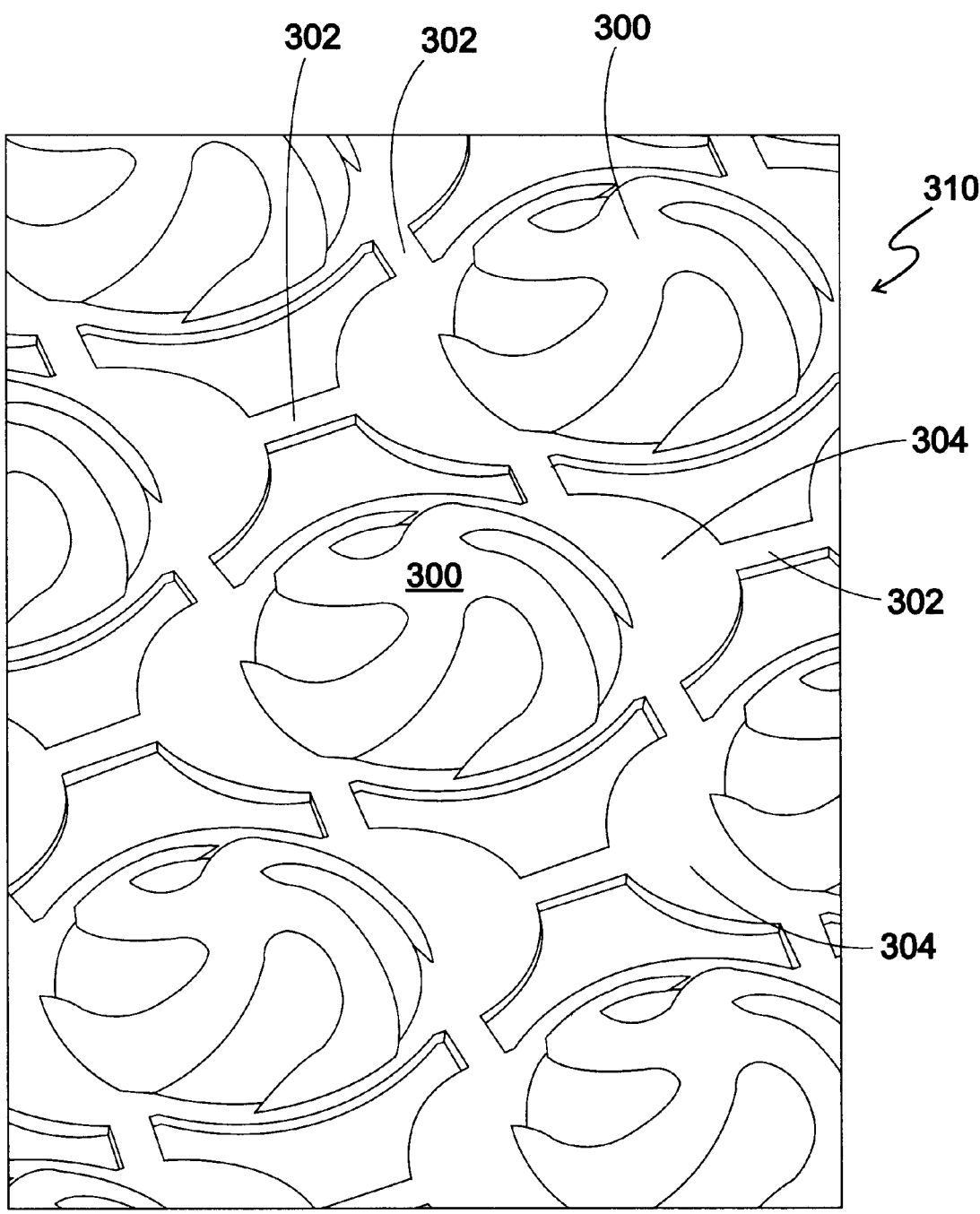
FIG. 3 is a perspective view of the metal sheet of FIG. 2 after masking and etching of the sheet to create a quantity of electrical contacts according to the present invention.

FIG. 3 is a perspective view of the metal sheet of FIG. 2 after masking and etching of the sheet 200 to create a quantity of micro-spiders, each on their own footing 304, according to the present invention. After the metal sheet 200 has been masked and etched, micro-spiders 300, footings 304, and connectors 302 between individual footings 304 remain forming an etched metal sheet 310. Note that while FIG. 3 shows a regular array of micro-spiders 300, there is no need for the plurality of micro-spiders 300 to form a regular array, instead they may be formed only in locations where needed and longer connectors 302 used to connect the plurality of micro-spiders 300.

Figure 4:
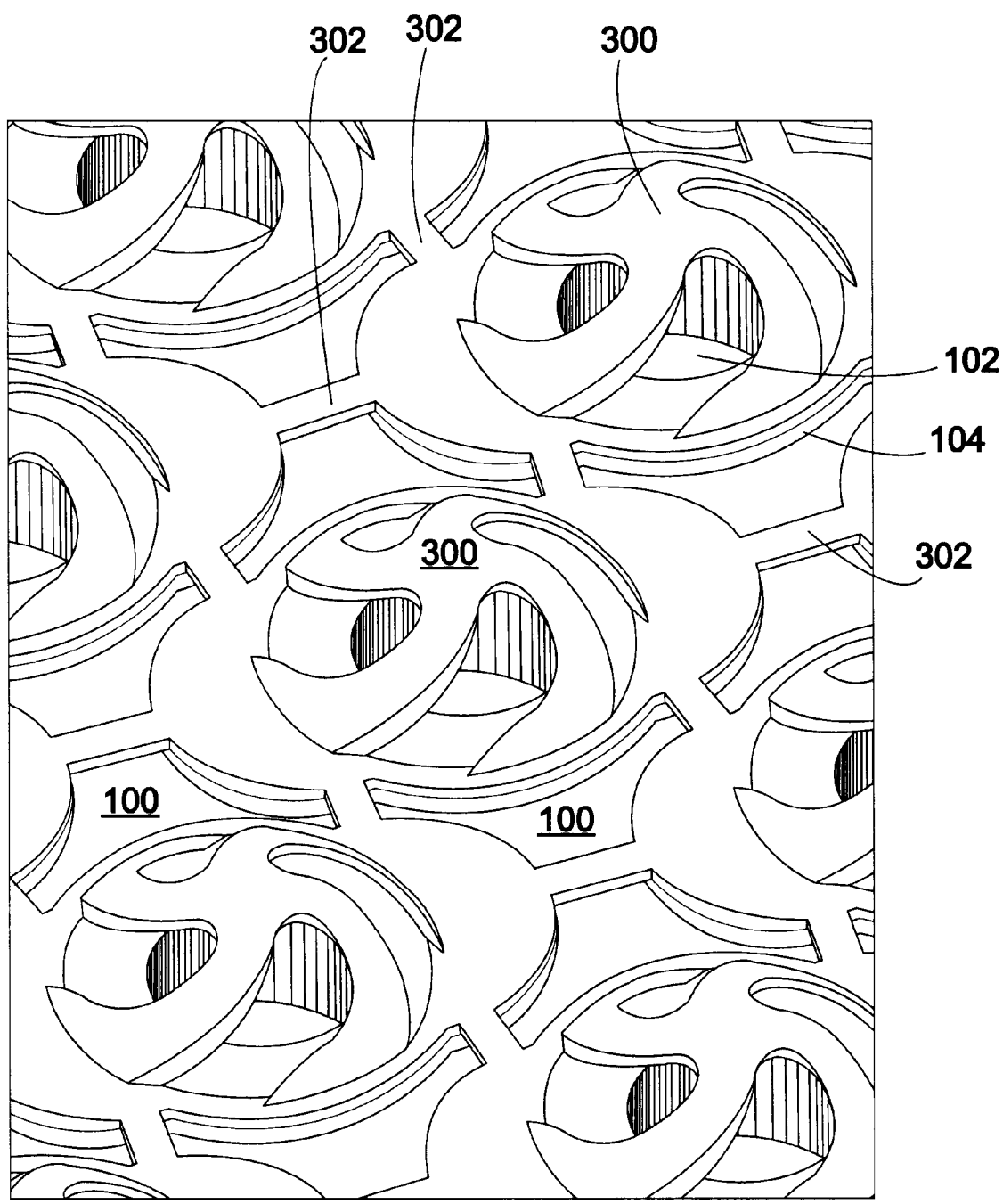
FIG. 4 is a perspective view of the structure created by soldering the metal sheet of FIG. 3 to the printed circuit board of FIG. 1 according to the present invention.

FIG. 4 is a perspective view of an embodiment of the structure created by soldering the metal sheet of FIG. 3 to the printed circuit board of FIG. 1 according to the present invention. The etched metal sheet 310 is soldered to the PCB structure of FIG. 1, thereby forming an array of plated-through vias 106 covered by a corresponding array of micro-spiders 300. The solder may be silk-screened onto the array of through-plated vias 106 to cover just the exposed metal areas 104 where it is desired that the micro-spiders 300 make electrical contact. At this point in the process the individual micro-spiders 300 are physically and electrically connected to the individual areas of metal plating 104 surrounding their corresponding via hole 102 in the PCB substrate 100.

Figure 5:
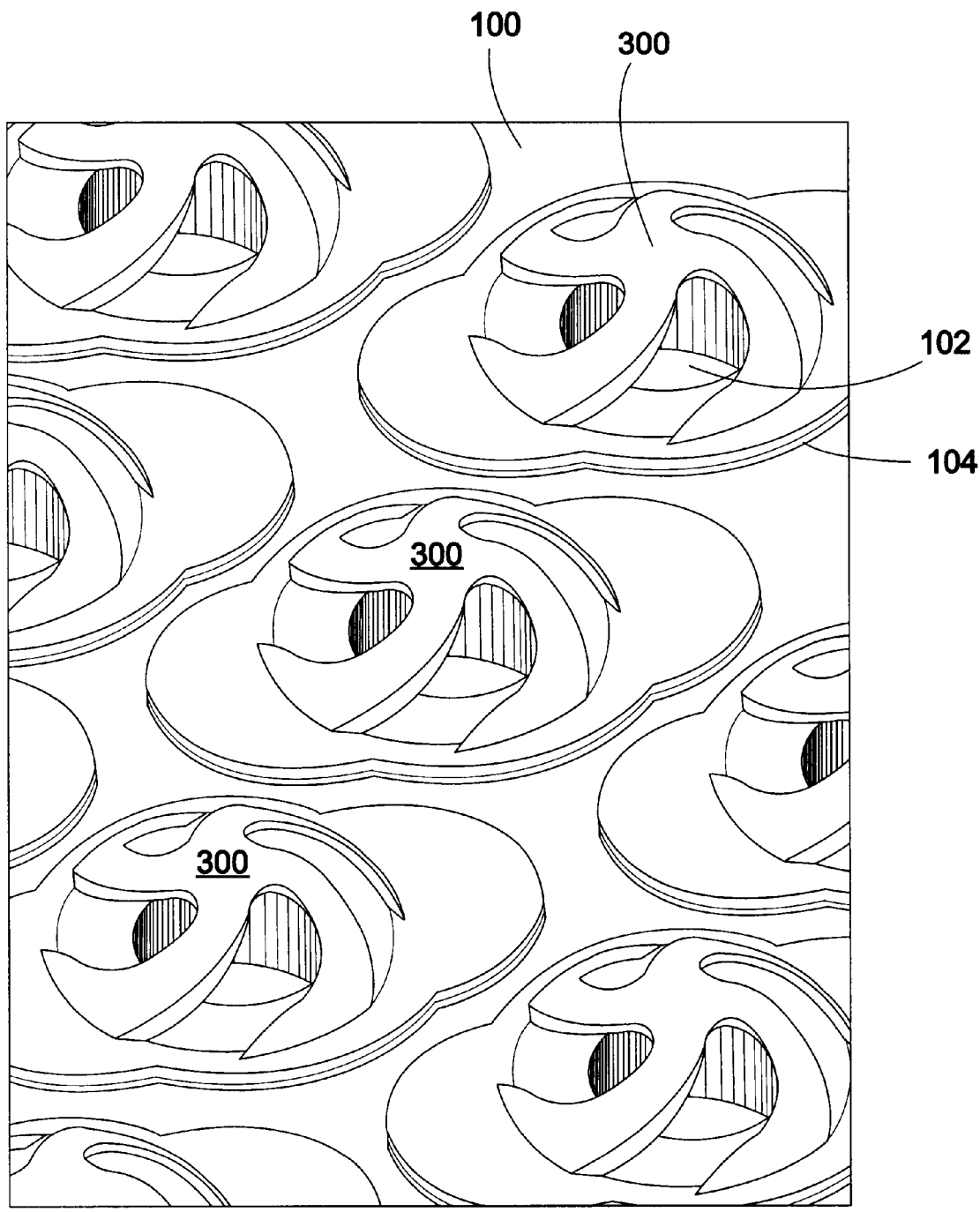
FIG. 5 is a perspective view of the structure of FIG. 4 after the connections between the individual electrical contacts have been etched away according to the present invention.

FIG. 5 is a perspective view of the structure of FIG. 4 after the connections between the individual micro-spiders have been etched away according to the present invention. At this point in the process, all of the micro-spiders 300 have been separated from each other physically and electrically by etching away all of the connectors 302 between the individual micro-spiders 300. Note that in some implementations of the present invention, it may be desired to have a plurality of micro-spiders 300 physically and electrically connected to each other at the completion of the interposer. In that case, the masking and etching of the PCB substrate 100 and the thin metal sheet 200 may be designed to leave larger areas of metal 104 surrounding the PCB vias 102 such that a plurality of vias are electrically connected, and corresponding areas of the thin metal sheet 200 may be left un-etched for later soldering to the array of through-plated vias 106. Such an alternate embodiment of the present invention may be useful for power supply connections that commonly require a large amount of current-carrying capability.

Figure 6:
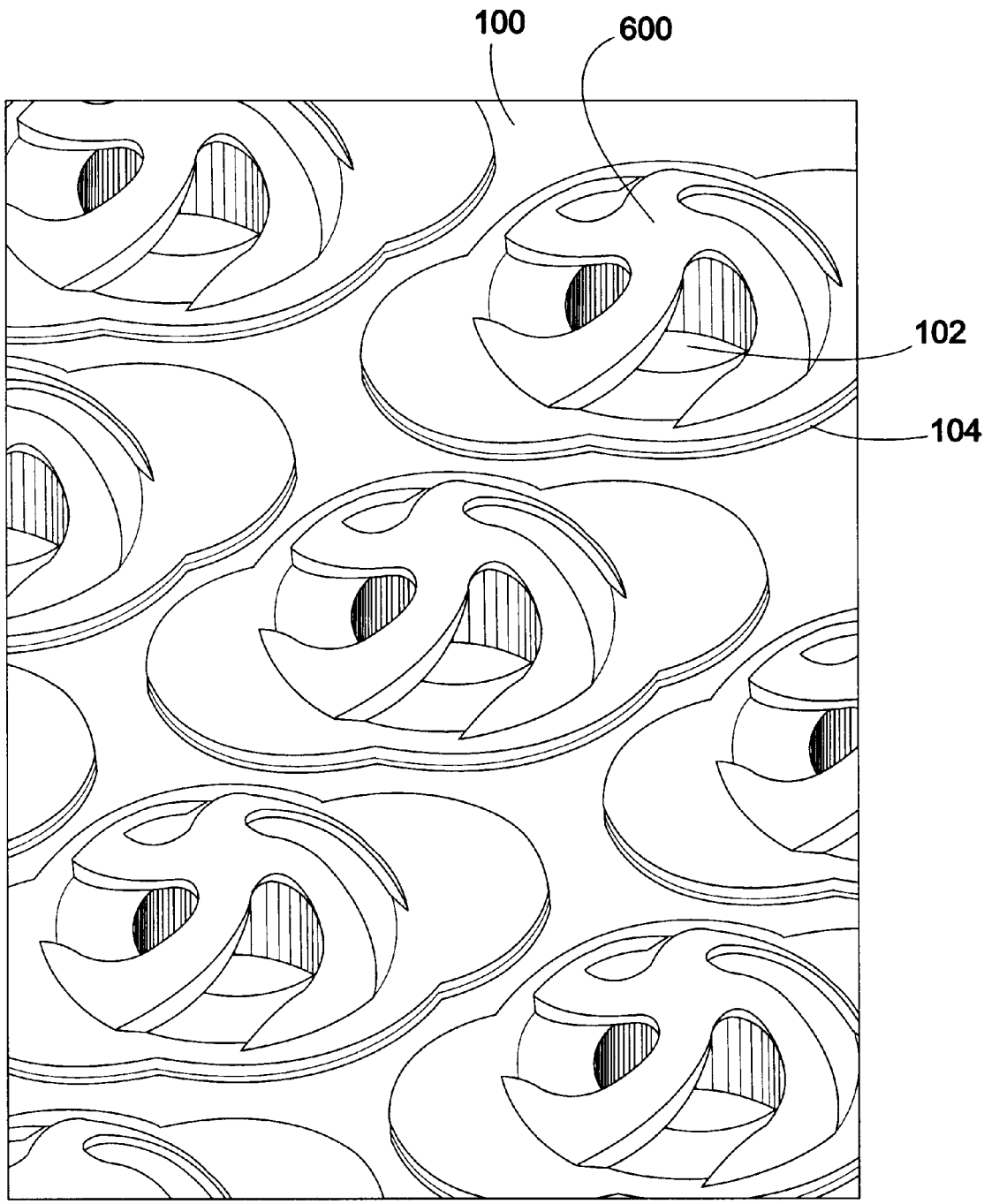
FIG. 6 is a perspective view of the structure of FIG. 5 after the electrical contacts have been plated according to the present invention.

FIG. 6 is a perspective view of the structure of FIG. 5 after the micro-spiders have been plated according to the present invention. In an example embodiment of the present invention, the micro-spiders 300 may be plated with nickel and gold, improving their durability and conductivity, and thereby forming an array of plated micro-spiders 600.

Figure 7:
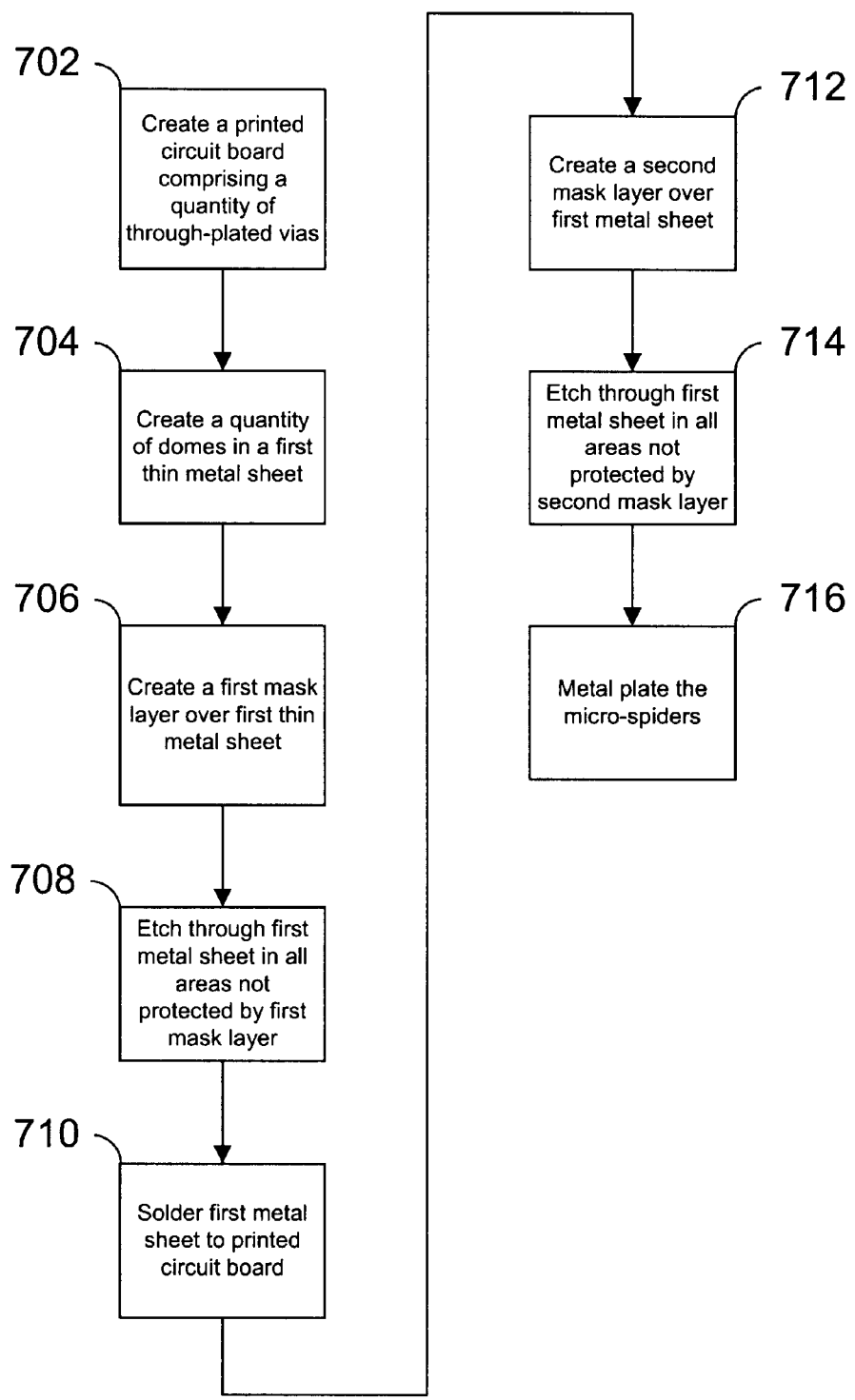
FIG. 7 is a flowchart of a method for the creation of electrical contacts according to the present invention.

FIG. 7 is a flowchart of a method for the creation of micro-spiders 300 according to the present invention. In a step 702, a PCB substrate 100 is plated, etched, and drilled to produce a plurality of through-plated vias 106 in the substrate 100. In a step 704, a quantity of domes are created in a first metal sheet 200. In an example embodiment of the present invention, the first metal sheet 200 may be copper. In a step 706, a first mask layer is created over the first metal sheet 200. In a step 708, the first metal sheet 200 is completely etched away in areas not protected by the mask, producing a quantity of micro-spiders 300, footings 304, and connectors 302. In a step 710, after the mask layer is cleaned off, the first metal sheet 200 comprising a quantity of micro-spiders 300 is soldered to the plurality of through-plated vias 106 in the substrate 100. In a step 712, a second mask layer is created over the first metal sheet 200. In a step 714, all of the areas of the first metal sheet 200 that are not protected by the second mask layer are completely removed by etching. In a preferred embodiment of the present invention, the connectors 302 are left unprotected by the second mask layer and removed in the etching step. In a step 716, the quantity of micro-spiders 300 is metal plated. Some methods of applying and patterning the first mask layer may have difficulties is creating an adequate mask layer over an irregular surface such as that resulting from step 704 (creating a quantity of domes in a metal sheet). Further, some photolithography systems may have difficulties in patterning a mask layer over an irregular surface, particularly with the sides of the domes. When using masking systems that are unable to create an adequate mask layer over an irregular surface, it may be necessary to perform the steps of the present invention in a different order than that shown in FIG. 7. For these reasons, in some example embodiments of the present invention, it may be beneficial to perform the step 706 of creating a first mask layer over the first metal sheet before the step 704 of creating a quantity of domes in the first metal sheet.

Figure 8:
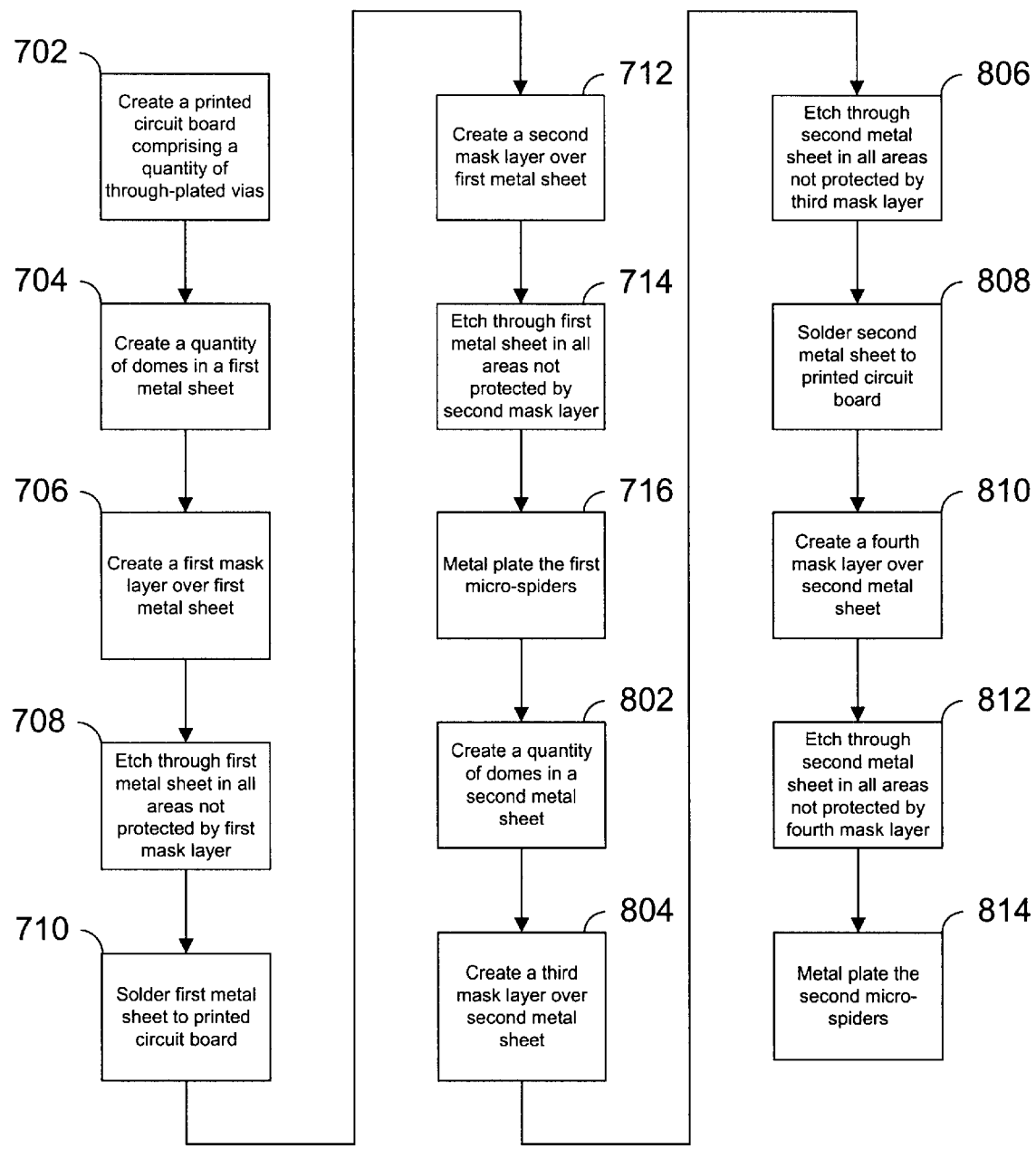
FIG. 8 is a flowchart of a method for the creation of an interposer comprising micro-spiders according to the present invention.

FIG. 8 is a flowchart of a method for the creation of an interposer comprising micro-spiders according to the present invention. The method for the creation of an interposer including micro-spiders shown in this example embodiment of the present invention includes the steps of the method shown in FIG. 7, with the addition of steps to preferably create an additional quantity of micro-spiders on the opposite side of the printed circuit board substrate. As explained in connection with FIG. 7, in a step 716, the quantity of micro-spiders 300 is metal plated. In a step 802, a quantity of domes is created in a second metal sheet 200. This step 802 may occur concurrently with step 702, if desired. In a step 804, a third mask layer is created over the second metal sheet 200. This step 804 may occur concurrently with step 706, if desired. In a step 806, the second metal sheet 200 is completely etched away in areas not protected by the third mask, producing a quantity of micro-spiders 300. This step 806 may occur concurrently with step 708, if desired. In a step 808, after the third mask layer is cleaned off, the second metal sheet 200 including a quantity of micro-spiders 300 is soldered to the plurality of through-plated vias 106. This step 808 may occur concurrently with step 710, if desired. In a step 810, a fourth mask layer is created over the second metal sheet 200. This step 810 may occur concurrently with step 712, if desired. In a step 812, all of the areas of the second metal sheet 200 that are not protected by the fourth mask layer are completely removed by etching. This step 812, may occur concurrently with step 714, if desired. In a step 814, the second quantity of micro-spiders 300 is metal plated. This step 814, may occur concurrently with step 716, if desired. Once again, in some embodiments of the present invention, it may be desirable to create the mask layers over the thin metal sheets before forming the domes in the thin metal sheets. This example embodiment (FIG. 8) of the present invention may be used to create a dual micro-spider interposer for use between a printed circuit board and a circuit module, such as an application-specific integrated circuit (ASIC) package, or a multi-chip module. The dual micro-spider interposer is easy to remove from the printed circuit board without costly rework of the board. This allows for quick and easy changes of the circuit module, including changes in the field, if needed.

Figure 9:
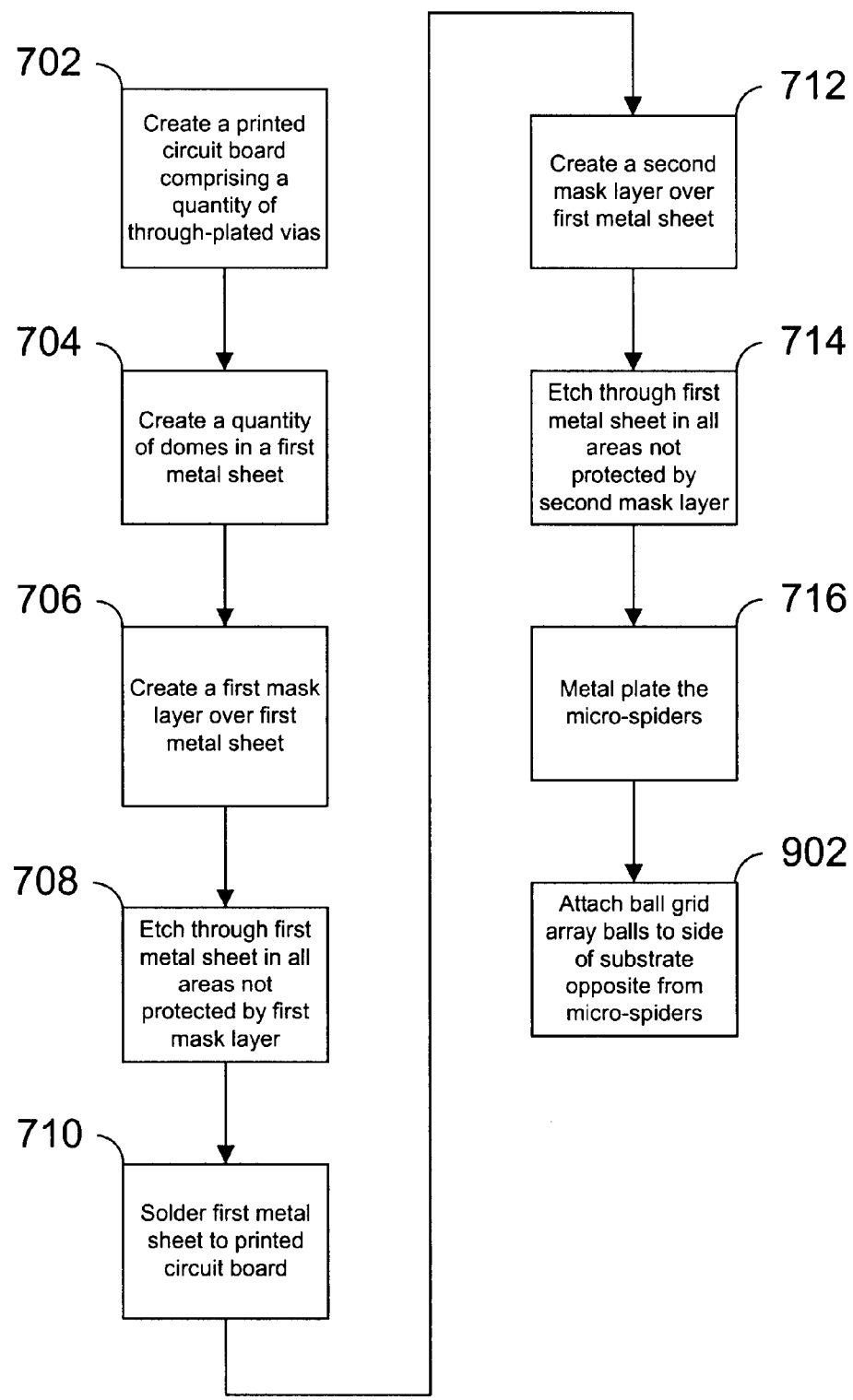
FIG. 9 is a flowchart of a method for the creation of an interposer comprising micro-spiders and ball grid array (BGA) balls according to the present invention.

FIG. 9 is a flowchart of a method for the creation of an interposer comprising micro-spiders and ball grid array (BGA) balls according to the present invention. The method for the creation of an interposer including micro-spiders and BGA balls shown in this example embodiment of the present invention includes the steps of the method shown in FIG. 7, with the addition of steps to preferably create a quantity of BGA balls on the opposite side of the printed circuit board substrate. As explained in connection with FIG. 7, in a step 716, the quantity of micro-spiders 300 is metal plated. In a step 902, ball grid array (BGA) balls are attached to the side of the substrate opposite from the micro-spiders. Once again, in some embodiments of the present invention, it may be desirable to create the mask layers over the thin metal sheets before forming the domes in the thin metal sheets. By creating an interposer comprising micro-spiders on one side and BGA balls on the other, thinner gold may be used on a printed circuit board that the BGA side of the interposer attaches to. This enables the use of standard BGA attachment processes to attach the interposer to the printed circuit board. While this implementation of the present invention (FIG. 9) enables less expensive plating on the printed circuit board, the removeability of the dual micro-spider interposer (FIG. 8) allows for easier re-work than the micro-spider BGA interposer.

Figure 10:
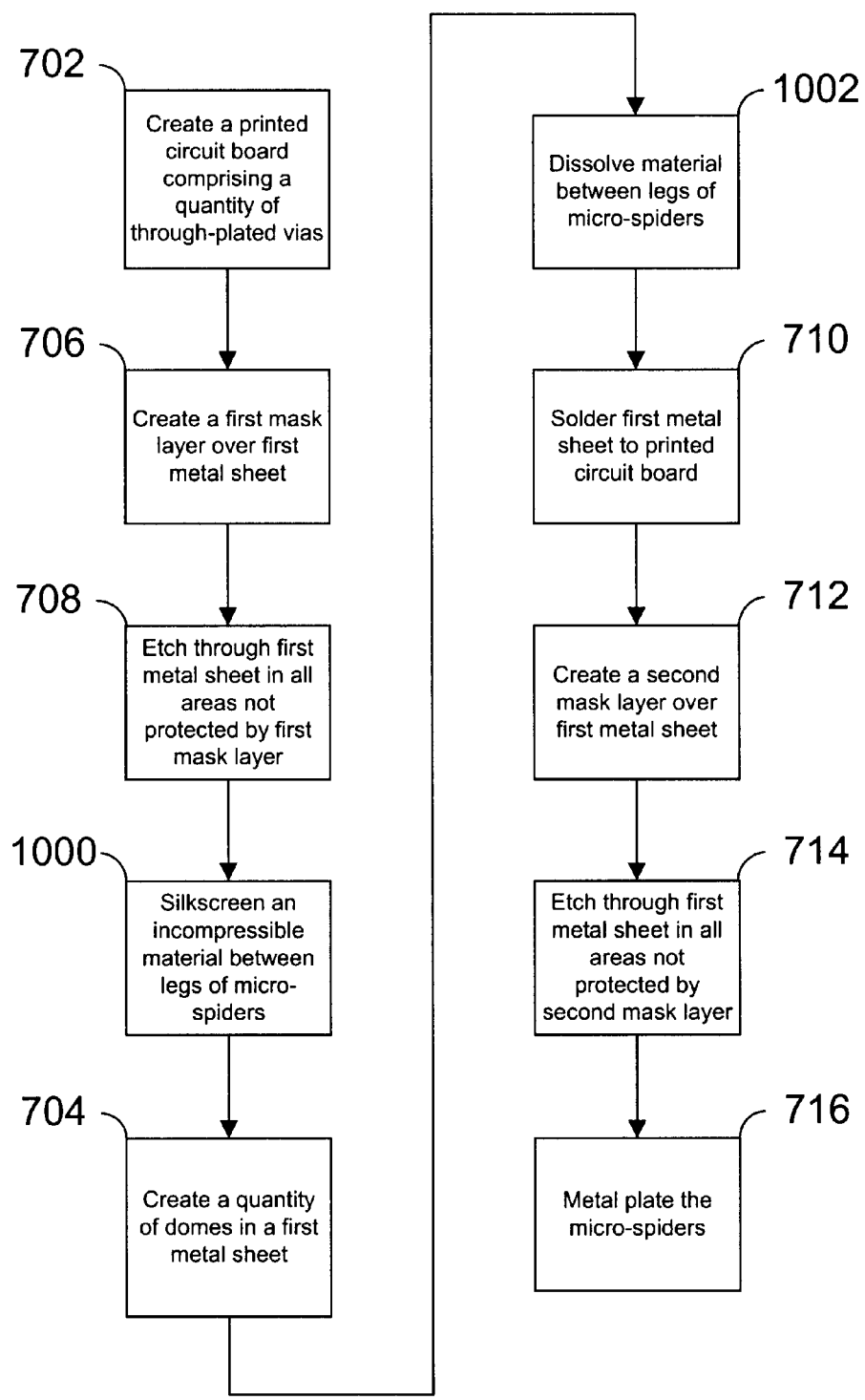
FIG. 10 is a flowchart of a method for the creation of micro-spiders according to the present invention.

FIG. 10 is a flowchart of a method for the creation of micro-spiders in accordance with the present invention. In an example embodiment of the present invention similar to the method of FIG. 7, a metal sheet is etched into a micro-spider configuration before the micro-spiders are domed. This method allows for masking and etching of the metal sheet before dome formation, eliminating the difficulties of masking and etching a domed surface. In a step 702, a PCB substrate 100 is plated, etched, and drilled to produce a plurality of through-plated vias 106. In a step 706, a first mask layer is created over a first metal sheet 200. In a step 708, the first metal sheet 200 is completely etched away in areas not protected by the mask, producing a quantity of micro-spiders 300, footings 304, and connectors 302. In a step 1000, a substantially incompressible material is deposited between the legs of the micro-spiders etched into the metal sheet. The substantially incompressible material is used to keep the legs of the micro spider from improperly bending during the step 704 of forming domes. It may comprise a material such as plaster of paris, and one example embodiment of the present invention uses a silk-screening process for applying the material. Next, in a step 704, a quantity of domes are created in the first metal sheet 200. In a step 1002, the substantially incompressible material is removed from between the legs of the micro-spiders. Depending on the material used, the substantially incompressible material may be removed by dissolution or other equivalent processes. In a step 710, after the mask layer is cleaned off, the first metal sheet 200 including a quantity of micro-spiders 300 is soldered to the plurality of through-plated vias 106. In a step 712, a second mask layer is created over the first metal sheet 200. In a step 714, all of the areas of the first metal sheet 200 that are not protected by the second mask layer are completely removed by etching. In a step 716, the quantity of micro-spiders 300 is metal plated.

Figure 11:
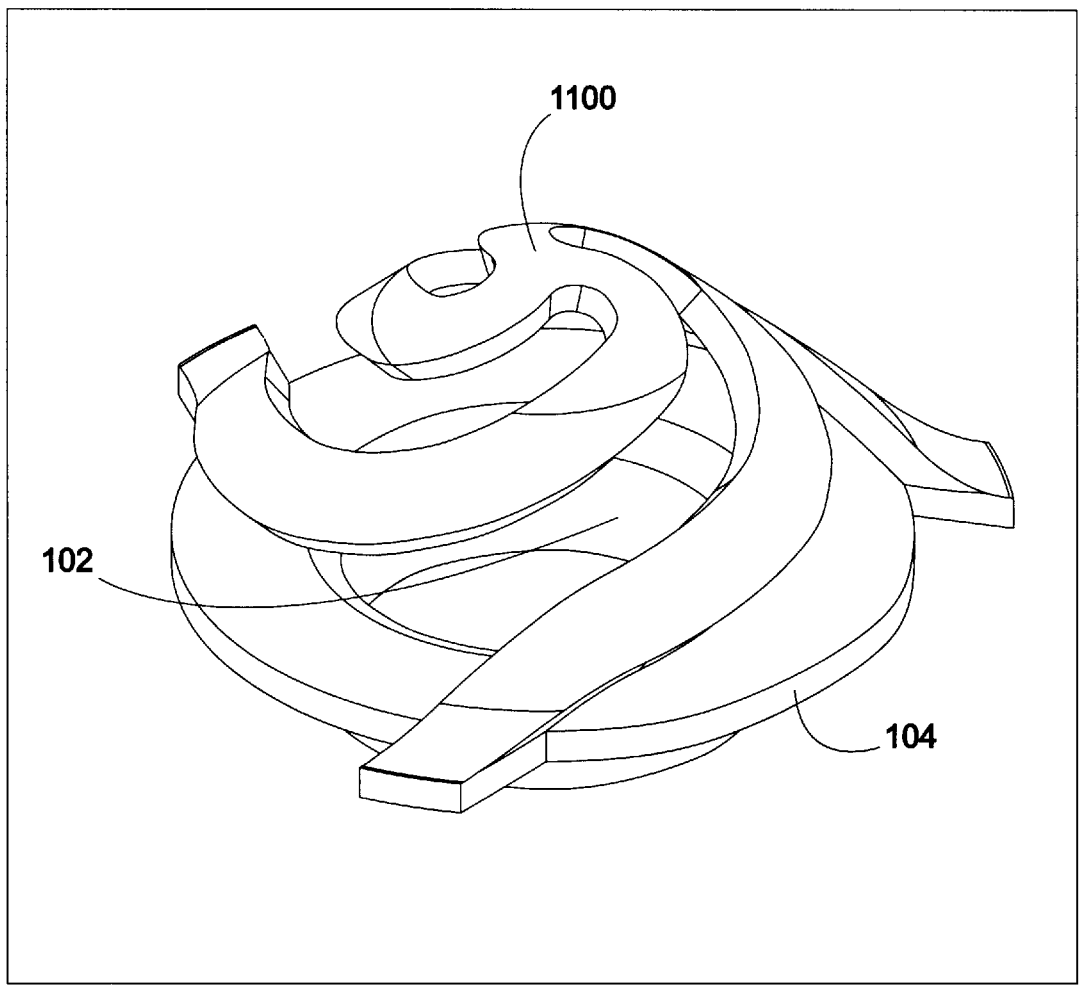
FIG. 11 is a perspective view of an embodiment of a three-legged micro-spider according to the present invention.

FIG. 11 is a perspective view of an embodiment of a three-legged micro-spider according to the present invention. A three-legged micro-spider 1100 is shown connected to the area of metal 104 surrounding a through-plated hole 102 in a substrate 100.

Figure 12:
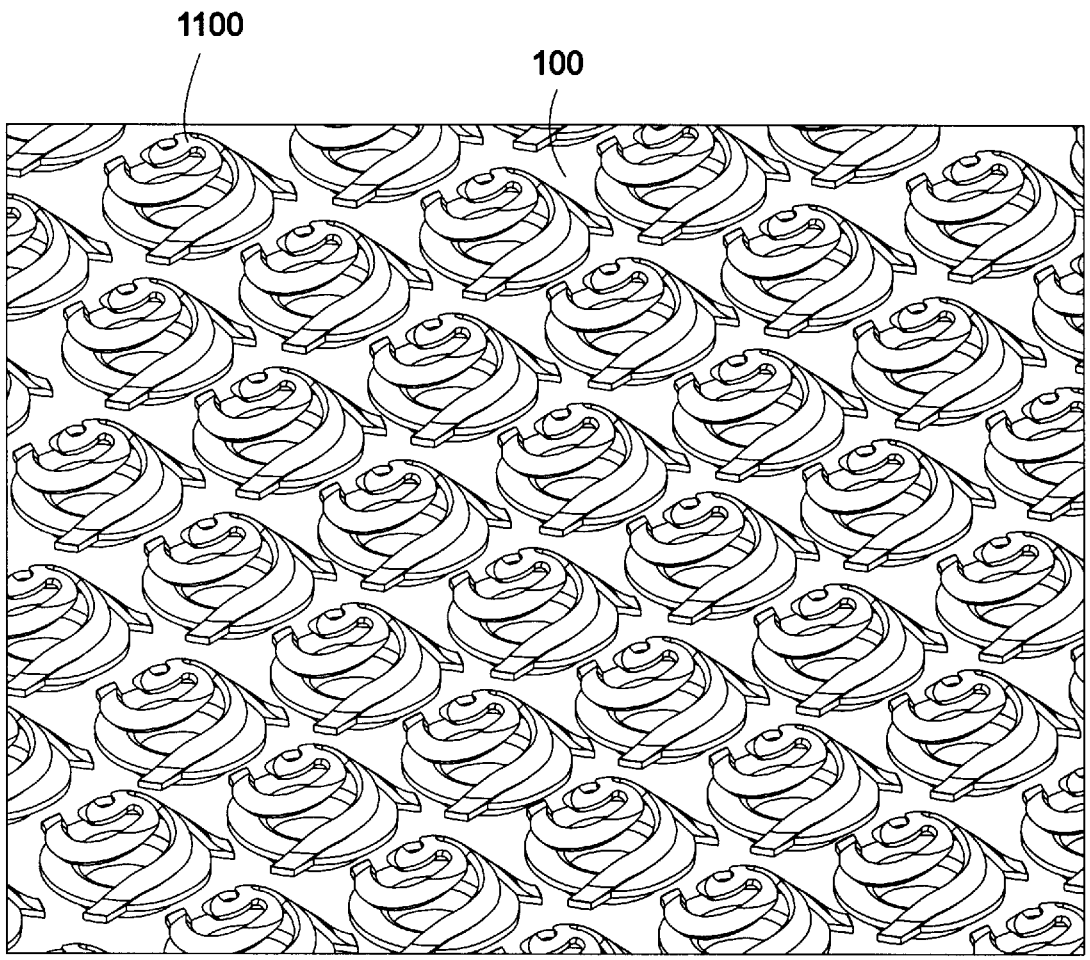
FIG. 12 is a perspective view of embodiment of a plurality of three-legged micro-spiders on a substrate according to the present invention.

FIG. 12 is a perspective view of a plurality of an embodiment of three-legged micro-spiders 1100 on a substrate 100 in accordance with the present invention. While this figure shows a regular array of micro-spiders 1100, other embodiments of the present invention may use an irregular array of micro-spiders 1100 as desired by the intended use of the plurality of micro-spiders 1100. Further, micro-spiders may be constructed with any number of legs (greater than one) as desired by an intended use, within the scope of the present invention.

Figure 13:
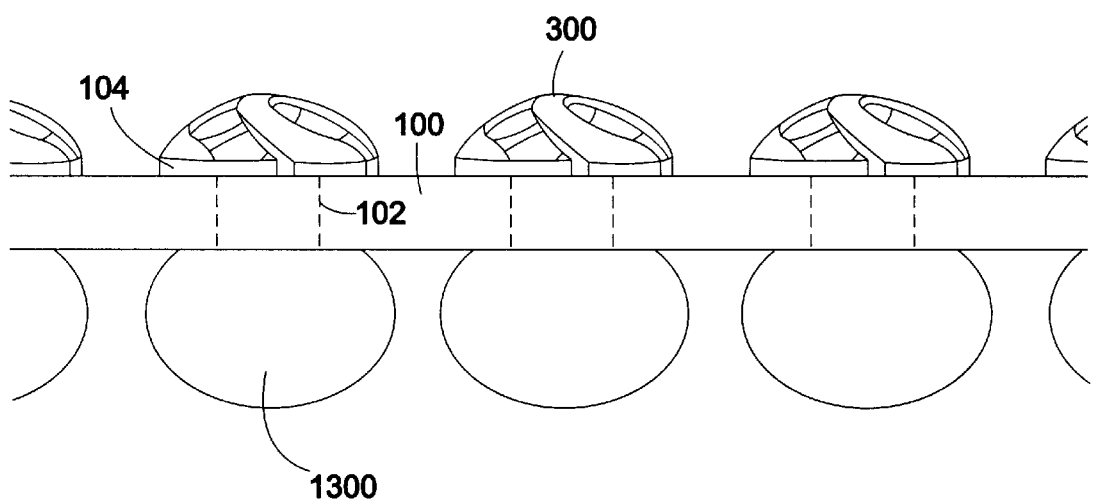
FIG. 13 is a cross-sectional view of an embodiment of the present invention illustrating micro-spiders constructed on a first side of a substrate and ball grid array (BGA) balls constructed on a second side of a substrate.

In a specific example embodiment of the present invention, micro-spiders 300 are preferably constructed on a first side of the substrate 100 and ball grid array balls 1000 are preferably constructed on a second side of the substrate 100, creating an interposer for use in non-permanently attaching electronic devices such as a multi-chip module (MCM) to a circuit board. FIG. 13 is a cross-sectional view of such an embodiment. The example embodiment of the present invention shown in FIG. 13 illustrates a plurality of micro-spiders 300 constructed on a first side of a substrate and ball grid array (BGA) balls 1300 constructed on a second side of a substrate 100, connected together by through-plated holes 102 surrounded by areas of metal 104 contacting the micro-spiders 300. This example embodiment of the present invention may be employed as an interposer for use in non-permanently attaching electronic devices such as a MCM to a circuit board, while the interposer is attached to the circuit board by the BGA balls 1300. The example embodiment of the present invention may be fabricated using the process described in connection with FIG. 9.

The resulting micro-spiders are described further in a U.S. patent application, Ser. No. 09/917,361, "Electrical Contact", filed concurrently with the present application, and incorporated herein by reference. Another method for the fabrication of micro-spiders is described further in a U.S. patent application, Ser. No. 09/917,093, "Method for the Fabrication of Electrical Contacts", filed concurrently with the present application, and incorporated herein by reference.

What is claimed is:

1. A method for the fabrication of electrical contacts comprising the steps of:
   a) through-plating a plurality of a plurality of vias in a substrate;
   b) forming a plurality of domes in a first metal sheet;
   c) placing a first mask layer on said first metal sheet;
   d) first etching said first metal sheet in all areas not protected by said first mask layer thereby producing a plurality of electrical contacts, wherein said electrical contacts include spiraling legs configured to create a wiping action on metal pads;
   e) soldering said etched first metal sheet to said plurality of through-plated vias;
   f) placing a second mask layer on said etched first metal sheet; and
   g) second etching said etched first metal sheet in all areas not protected by said second mask layer resulting in the physical and electrical separation of at least some of said plurality of electrical contacts.

2. The method for the fabrication of electrical contacts of claim 1, wherein said substrate includes metal areas surrounding substantially all locations of said vias before said vias are created in said substrate.

3. The method for the fabrication of electrical contacts of claim 1, further comprising the step of:
   h) plating said second etched first metal sheet.

4. The method for the fabrication of electrical contacts of claim 3, wherein said plating uses gold.

5. The method for the fabrication of electrical contacts of claim 3, wherein said plating uses nickel and gold.

6. The method for the fabrication of electrical contacts of claim 1, further comprising the step of:
   h) removing said first mask layer after said first etching is complete.

7. The method for the fabrication of electrical contacts of claim 1, further comprising the step of:
   h) removing said second mask layer after said second etching is complete.

8. The method for the fabrication of electrical contacts of claim 1, wherein said metal sheet is copper.

9. The method for the fabrication of electrical contacts of claim 1, wherein said second etching step separates less than all of said plurality of electrical contacts.

10. The method for the fabrication of electrical contacts of claim 1, wherein said substrate is a printed circuit board substrate.

11. The method for the fabrication of electrical contacts of claim 1, further comprising the steps of:

h) forming a plurality of domes in a second metal sheet;

i) placing a third mask layer on said second metal sheet;

j) first etching said second metal sheet in all areas not protected by said third mask layer thereby producing a plurality of electrical contacts, wherein said electrical contacts include spiraling legs configured to create a wiping action on metal pads;

k) soldering said etched second metal sheet to said plurality of through-plated vias on opposing side of said substrate from said etched first metal sheet;

l) placing a fourth mask layer on said etched second metal sheet; and m) second etching said etched second metal sheet in all areas not protected by said fourth mask layer resulting in the physical and electrical separation of at least some of said plurality of electrical contacts.

12. The method for the fabrication of electrical contacts of claim 11, wherein said second etching of said etched first metal sheet and said second etching of said etched second metal sheet occur at least partially concurrently.

13. The method for the fabrication of electrical contacts of claim 1, further comprising the steps of:

h) adding a plurality of ball grid array balls to said through-plated vias on a side of said substrate opposite from said plurality of electrical contacts.

\* \* \* \* \*